United States Patent [19]

Kerr

[11] Patent Number: 5,034,788

[45] Date of Patent: Jul. 23, 1991

[54] SEMICONDUCTOR DEVICE WITH REDUCED SIDE WALL PARASITIC DEVICE ACTION

[75] Inventor: John A. Kerr, Lakelands, England

[73] Assignee: Marconi Electronic Devices Limited, England

[21] Appl. No.: 603,465

[22] Filed: Oct. 25, 1990

Related U.S. Application Data

[63] Continuation of Ser. No. 249,846, Sep. 27, 1988, abandoned.

[30] Foreign Application Priority Data

Oct. 9, 1987 [GB] United Kingdom ............... 8723775

[51] Int. Cl.$^5$ ............... H01L 27/01; H01L 29/78; H01L 29/04; H01L 27/12
[52] U.S. Cl. ............... 357/23.7; 357/23.14; 357/59; 357/4
[58] Field of Search ............... 357/23.7, 23.14, 59, 357/4

[56] References Cited

U.S. PATENT DOCUMENTS

| | | |
|---|---|---|
| 3,890,632 | 6/1975 | Ham et al. ............... 357/23.7 |
| 4,015,279 | 3/1977 | Ham ............... 357/23.7 |
| 4,748,485 | 5/1988 | Vasudev ............... 357/4 |

Primary Examiner—Mark Prenty
Attorney, Agent, or Firm—Kirschstein, Ottinger, Israel & Schiffmiller

[57] ABSTRACT

A semiconductor device having a sapphire substrate on which is formed a localized island of polysilicon, the island having side walls which extend away from a surface of the substrate. A field effect transistor is formed in the island and a doped polysilicon fillet is interposed between the gate region and the substrate. In addition the electrical potential of the polysilicon fillet is controlled with respect to the source region. The control of the electrical potential enables the premature turn on characteristics of the device to be reduced by the polysilicon fillet forming a secondary gate electrode on the side walls, and because these secondary gates are at source potential the parasitic edge transistor present in the side wall is always turned off. A modified device has an independent side gate bias arrangement.

6 Claims, 2 Drawing Sheets

SEMICONDUCTOR DEVICE WITH REDUCED SIDE WALL PARASITIC DEVICE ACTION

This is a continuation of application Ser. No. 249,846, filed Sept. 27, 1988, now abandoned.

BACKGROUND OF THE INVENTION

1. Field of the Invention

This invention relates to a semiconductor device and more especially to a field effect transistor on an insulating substrate.

2. Description of Related Art

Semiconductor material is usually deposited onto a substrate which has a crystalline structure compatible with the chosen semiconductor material so as to form an epitaxial layer. Selected areas of the semiconductor material are etched away to leave an array of localized islands or "mesas" in close proximity to each other. Field effect transistors are then formed in the islands of semiconductor material by conventional techniques. However, it has been found that although close proximity of the islands is possible using this technique, problems of sidewall parasitic device action occurs on the islands which leads to serious current leakage difficulties and premature turn on characteristics of the devices.

SUMMARY OF THE INVENTION

An aim of the invention is to provide an improved semiconductor device.

According to the invention there is provided a semiconductor device comprising a substrate of electrically insulating material, a localized island of semiconductor material formed on the substrate, the island having side walls extending away from a surface of the substrate, means defining a field effect transistor in the island having a source, drain, channel and gate regions, a doped semiconductor area interposed between the gate region and the substrate, and means for enabling the electrical potential of the semiconductor area to be controlled with respect to the source region.

The semiconductor device is made by forming a localized island of epitaxial semiconductor material on an insulating substrate, the island having side walls extending from the substrate, forming an area of doped semiconductor material adjacent the side wall and spaced from the side wall by an intermediate layer of insulating material, and forming a gate electrode on the island and superimposed the doped area such that the gate electrode is spaced from a channel region underlying the gate electrode and the side wall by the doped area for facilitating control of the electrical potential of the doped area with respect to a source region.

BRIEF DESCRIPTION OF THE DRAWINGS

Embodiments of the invention will now be described by way of example only and with reference to the accompanying drawings in which.

DETAILED DESCRIPTION OF THE PREFERRED EMBODIMENTS

Figure 1:
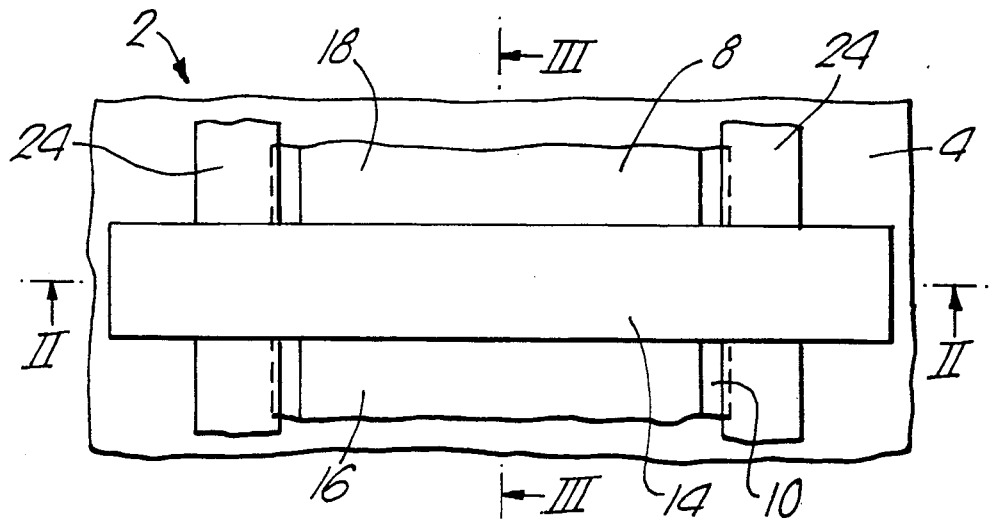
FIG. 1 diagrammatically illustrates in plan view a semiconductor device according to the invention.

With reference to FIGS. 1, 2, 3 and 4 of the drawings a semiconductor device 2 includes a substrate 4 of sapphire which is approximately $500 \times 10^{-6}$ m thick and is provided with a smooth highly polished upper surface 6. Upon this surface 6 epitaxial silicon is grown and subsequently formed into localized islands 8 or "mesas" as subsequently described. The islands 8 have sloping side walls 10 having a 111 crystal orientation as opposed to the 100 crystal orientation of an upper surface 12 of the island 8. Typically the bulk of the island 8 is p-typed doped.

Figure 2:
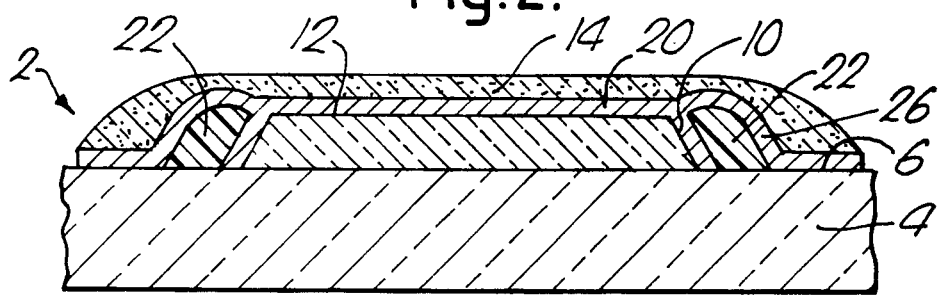
FIG. 2 diagrammatically illustrates a cross-sectional elevation taken along the line II—II of FIG. 1.
Figure 3:
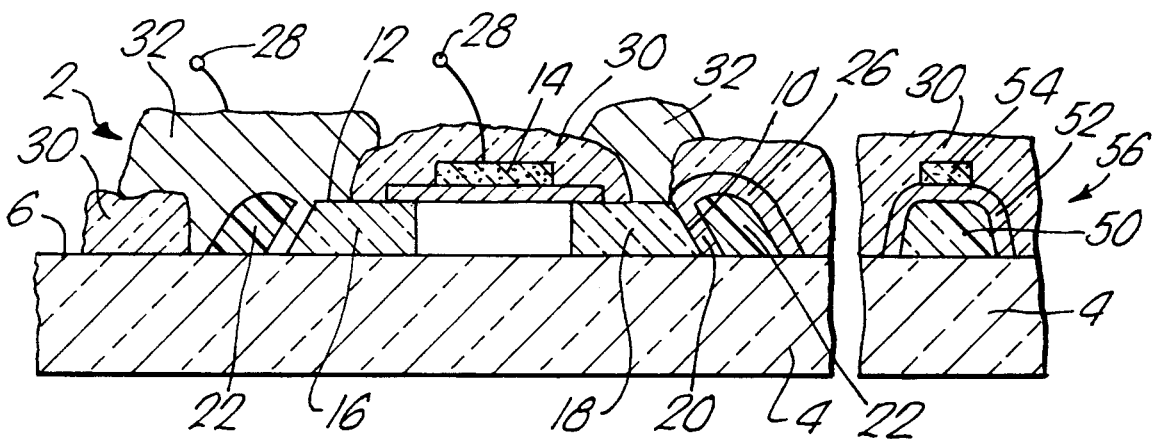
FIG. 3 diagrammatically illustrates a cross-sectional elevation taken along the line III—III of FIG. 1 together with a polysilicon capacitor.
Figure 4:
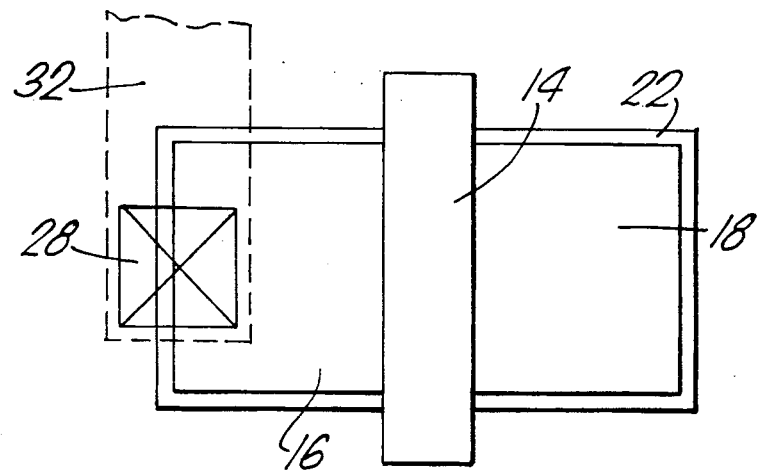
FIG. 4 diagrammatically illustrates in plan view the semiconductor device of FIG. 1 together with electrical connections to portions of the device.

A polycrystalline silicon gate electrode 14 extends across a portion of the island 8 and the region of silicon beneath the gate electrode 14 remains p-type, whilst the exposed regions 16 and 18 at each side of the gate electrode are doped with an n-type dopant to form source and drain 16, 18 respectively. A channel region can be formed between the source and drain regions 16, 18 on application of a suitable electrical potential to the gate electrode 14. The gate electrode 14 is insulated from the body of the island 8 by an intervening layer of oxide 20 as shown in FIGS. 2 and 3.

Underlying the gate electrode 14 adjacent the side walls 10 of the island 8 are polysilicon fillets 22 which are doped with an n-type dopant. The fillets 22 are spaced from the side walls 10 of the island by the intervening oxide layer 20 and project away from under the gate electrode 14 as shown in FIG. 1 at 24. The fillets 22 are also at least partially surrounded by an insulating layer of oxide 26.

Electrical connections 28 are made to the gate electrode 14 and the polysilicon fillets 22 so that the electrical potential of polysilicon fillets 22 can be controlled with respect to the source region 16. In this example it is assumed that the fillets 22 are connected to the same potential as the source 16. Thus when a turn on voltage pulse is applied to the gate electrode 14 this creates the channel region to form a conductive path between the source 16 and drain 18 regions and the resultant voltage pulse effects the side wall 10 because the turn on voltage in the side wall 10 is lower than at a top surface of the island 8. However, because the polysilicon fillets 22 form a secondary gate electrode on the sidewalls 10 of the island 8 and because these secondary gates are at source potential the parasitic edge transistor present in the side walls 10 is always turned off and this reduces the effect of side wall parasitic device action caused by premature turn on characteristics. In addition the polysilicon fillets 22 act as an electrical screen to the gate electrode 14 so that the edge transistor is relatively unaffected by changes in the electrical potential of the gate electrode 14.

The semiconductor device 2 is manufactured by a process in which the highly polished upper surface 6 of the substrate 4 is initially uniformly covered with an epitaxially grown layer of silicon. The silicon is made sufficiently p-type by the incorporation of a boron dopant to a concentration of about $10^{-6}$ atom/cc. Typically the sapphire substrate has a thickness of $500 \times 10^{-6}$ m upon which the epitaxial layer is grown to a thickness of about $0.5 \times 10^{-6}$ m. Using a suitable photolithographic masking and etching technique of a conventional kind regions of the epitaxial silicon layer are removed to leave an array of localized islands 8 or "mesas", one of which is shown in FIG. 1, separated by exposed regions of substrate 4.

With reference to the drawings, the or each selected islands 8 are then etched by a known technique to provide the smooth upper surface 12 having a 100 crystal orientation. On this smooth upper surfaced 12 is thermally grown the layer 20 of silicon oxide approximately $400 \times 10^{-10}$ m thick. After this a layer of polysilicon is deposited on the oxide layer 20, doped with an n-type dopant, masked with a suitable mask, and etched using conventional techniques to form the polysilicon fillets 22. Then the island 8 covered with the oxide layer 20 is dip etched and the insulating silicon oxide layer 26 is grown over the island 8 and fillets 22. The process chosen to grow the oxide layer 26 is a wet thermal oxidation process which causes preferential growth of the oxide layer over the polysilicon fillets 22 as shown in FIGS. 2 and 3. Typically the thickness of the oxide layer 26 over the polysilicon fillets 22 is $1400 \times 10^{-10}$ m and over the remaining portion of the island 8 is $350 \times 10^{-10}$ m.

A second layer of polysilicon is then deposited on the island 8. The gate electrode 14 is then formed by doping with an n-type dopant followed by suitable masking and etching techniques. Typically the gate electrode 14 is $0.4 \times 10^{-6}$ m thick and covers the island 8 as shown in FIG. 1 so that the polysilicon fillets 22 at least partially underlie the gate electrode 14.

After this the source and drain regions 16, 18 are formed by using an n-type dopant using conventional techniques. Subsequently areas 30, shown in FIG. 3, of borophosilicate glass (BPSG) are deposited on the island 8 and substrate 4. The BPSG is a dielectric and aids the deposition of metal contact areas 32 onto the stepped structure of the island 8 and substrate 4. In addition the use of BPSG reduces the tendency of short circuits between adjacent islands. Windows are etched in the BPSG in which contact areas 32 are then formed as shown in FIG. 3. Also provided are the electrical connections 28 to the gate electrode 14 and the polysilicon fillets 22 to complete the semiconductor device 2.

With reference to FIG. 3 it should be noted that the source contact area 32 overlaps one of the polysilicon fillets 22 and is therefore subsequently shorted to the source region 16 by the metal contact area 32.

Figure 5:
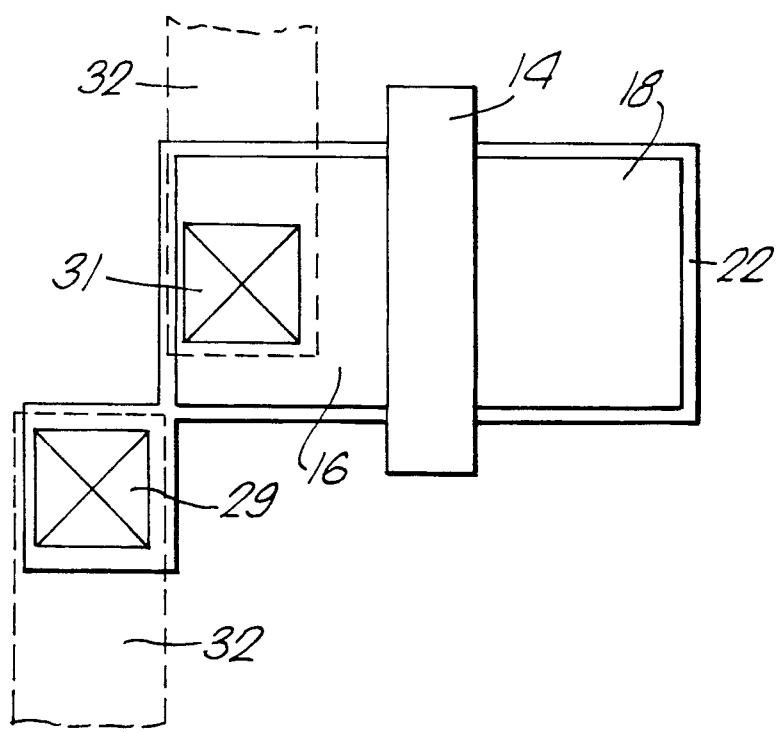
FIG. 5 diagrammatically illustrates in plan view a modified device according to the invention.

In a modification shown in FIG. 5 of the semiconductor device 2 separate electrical connections 29 and 31 respectively are made to the polysilicon fillets 22 and to the source region 16 so that the electrical potential of the polysilicon fillet 22 is variable with respect to the source region 16. This provides an independent side gate bias arrangement in which a relatively weak high on-resistance device can be formed in parallel with the main strong low on-resistance device and can be controlled independently. The edge transistor formed in the sidewalls 10 may be always turned off, as a separate bias voltage is provided by the separate connection 29, 31 to the polysilicon fillets 22 and the source region 16. Thus the edge transistor may be held hard off as opposed to merely having a zero source to edge gate bias.

With reference to FIG. 5, to form the modified device the polysilicon fillets 22 are formed as described in preceding paragraphs with the addition of a separate mask to facilitate the formation of the portion 23 of the fillet. The source, drain and gate electrodes 16, 18, 14 are then formed as previously described. Subsequently areas of borophosphosilicate glass (BPSG) are deposited on the island 8 and the portion 23 to aid deposition of metal contact areas. Windows are then etched in the BPSG in which discrete contact areas are formed. Subsequently the separate electrical connections 29, 31 are made to these discrete areas.

The modified device has the advantage of being especially useful in connection with critically radiation sensitive devices.

As typically two layers of polysilicon are deposited onto the islands then the process may be modified to simultaneously produce polysilicon capacitors in conjunction with the semiconductor devices 2 on the same substrate 4. With reference to FIG. 3 a lower capacitor plate 50 of polysilicon is deposited on the surface 6 of the substrate 4 during formation of the polysilicon fillets 22. Subsequently a layer 52 of silicon oxide is grown over the lower capacitor plate 50 during the wet thermal oxidation process to form the layer 26 over the island 8. After this an upper capacitor plate 54 of polysilicon is deposited on the layer 52 of oxide to form the capacitor 56 whilst the gate electrode 14 is being formed on the island 8. Subsequently the capacitor 56 is covered with BPSG.

It should be noted that as an alternative the polysilicon fillets 22 may surround the island 8, this is particularly useful when the separate electrical connections are made to the polysilicon fillets 22 and to the source region 16 so as to aid fabrication of the modified device.

It should be noted that the semiconductor device 2 may be doped with dopants of the opposite conductivity type to produce an p-type channel region between the source and the drain.

I claim:

1. A semiconductor device, comprising: a substrate of electrically insulating material; a localized island of semiconductor material formed on a surface of the substrate, the island having side walls extending away from said surface of the substrate; means defining a field effect transistor in the island having source, drain, channel and gate regions; a doped semiconductor area which is formed on said surface of the substrate and which is interposed between the gate region and the substrate adjacent at least one of said side walls, said doped semiconductor area being insulated from said channel region and from said gate region and forming a secondary gate region; and means for enabling the electrical potential of the doped semiconductor area to be controlled with respect to the source region.

2. A semiconductor device as claimed in claim 1, in which a separate connection is made to the doped semiconductor area and to the source region so that the electrical potential of the doped semiconductor area is variable with respect to that of the source region.

3. A semiconductor device as claimed in claim 1, in which the substrate is sapphire.

4. A semiconductor device as claimed in claim 1, in which the island of semiconductor material and the doped semiconductor area are formed of silicon.

5. A semiconductor device as claimed in claim 1 in which a plurality of said localized islands of semiconductor material are formed on a common surface of the substrate.

6. A semiconductor device; comprising: a substrate of electrically insulating material; a localized island of semiconductor material formed on the substrate, the island having side walls extending away from a surface of the substrate; means defining a field effect transistor in the island having source, drain, channel and gate regions; a doped semiconductor area interposed between the gate region and the substrate, said doped semiconductor area being insulated from said channel region and from said gate region and forming a secondary gate region; and means for enabling the electrical potential of the doped semiconductor are to be controlled with respect to the source region, said doped semiconductor area making a direct connection with the source region.

* * * * *